United States Patent
Clements et al.

(10) Patent No.: US 6,924,979 B2
(45) Date of Patent: Aug. 2, 2005

(54) MOUNTING APPARATUS FOR COUPLING CONTROL CIRCUITRY TO AN AIR MOVING DEVICE

(75) Inventors: Bradley Edgar Clements, Fort Collins, CO (US); Angela L. Minichiello, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 924 days.

(21) Appl. No.: 09/919,189

(22) Filed: Jul. 30, 2001

(65) Prior Publication Data

US 2003/0019646 A1 Jan. 30, 2003

(51) Int. Cl.[7] ................................................. H05K 7/20
(52) U.S. Cl. ...................... 361/695; 361/697; 361/721; 310/68 R; 318/254; 415/177
(58) Field of Search ................................ 361/695, 721, 361/697, 719, 741, 756; 257/721, 722; 165/80.3, 122, 104.33; 310/62–64, 68 C, 68 R, 42, 216, DIG. 6; 318/254, 473, 268, 472; 417/356, 354, 423.14; 415/177, 178, 213.1

(56) References Cited

U.S. PATENT DOCUMENTS

| | | | | |
|---|---|---|---|---|
| 4,164,690 A | * | 8/1979 | Muller et al. | 318/254 |
| 4,659,290 A | * | 4/1987 | Kundert | 417/32 |
| 5,615,998 A | * | 4/1997 | Kodama et al. | 415/177 |
| 5,925,948 A | * | 7/1999 | Matsumoto | 310/67 R |
| RE37,261 E | * | 7/2001 | Schmider et al. | 417/423.7 |
| 6,525,938 B1 | * | 2/2003 | Chen | 361/695 |
| 6,577,031 B2 | * | 6/2003 | Morooka et al. | 310/68 R |
| 6,592,400 B2 | * | 7/2003 | Shy et al. | 439/527 |
| 6,864,653 B2 | * | 3/2005 | von der Heydt | 318/434 |

* cited by examiner

Primary Examiner—Michael Datskovskiy

(57) ABSTRACT

A mounting apparatus for mounting control circuitry to an air moving device includes, in at least one embodiment, one or more retaining members operable to retain control circuitry for the air moving device. Preferably, the apparatus also includes one or more mounting members enabling the coupling of the apparatus to a portion of an air moving device other than a hub. In a preferred embodiment, the dimensions of the mounting apparatus, as well as the control circuitry, are such that when an assembly comprising the mounting apparatus and the control circuitry is coupled to the air moving device, the assembly does not protrude beyond the volume of the air moving device.

20 Claims, 4 Drawing Sheets

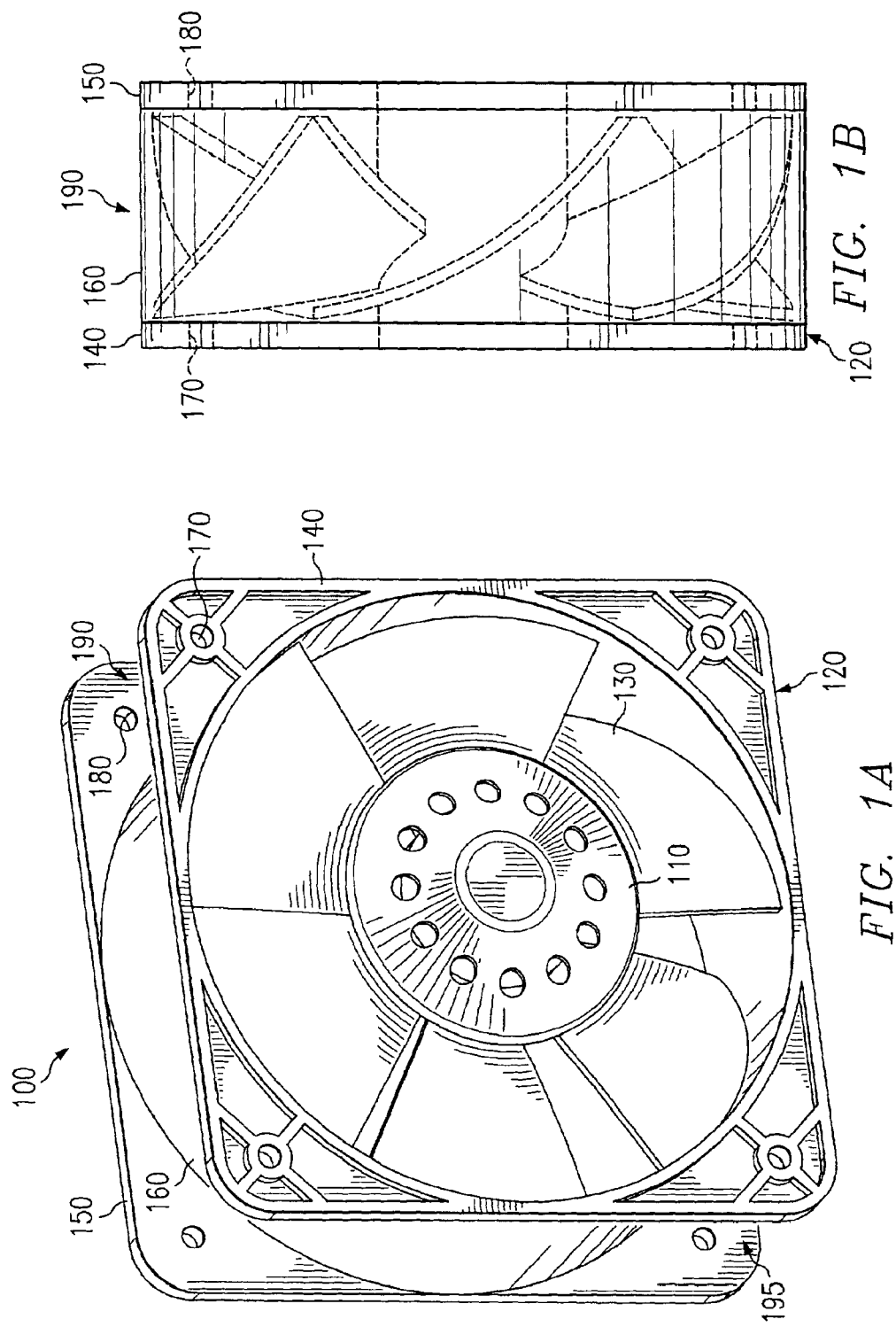

MOUNTING APPARATUS FOR COUPLING CONTROL CIRCUITRY TO AN AIR MOVING DEVICE

RELATED APPLICATION

This application is related to co-pending and commonly assigned U.S. patent application Ser. No. 09/798,402 entitled "ADAPTIVE SYNCHRONOUS DC FAN SPEED CONTROLLER" filed Mar. 2, 2001, the disclosure of which is hereby incorporated herein by reference.

TECHNICAL FIELD

The present invention relates to systems and methods for aerodynamic flow, and in one aspect to a mounting apparatus for coupling control circuitry to an air moving device.

BACKGROUND OF THE INVENTION

Air moving devices such as fans and blowers are an important aspect of cooling and/or ventilation systems, such as the cooling systems employed in today's electronic devices, systems, etc. (e.g., computer devices such as central processing units (CPUs), server devices, storage devices, video cards, and the like). In the case of electronic devices, systems, etc., such air moving devices are typically used to push and/or draw air across heat sinks, in order to remove waste heat from components of these electronic devices, systems, and the like.

Control circuitry is often employed to control one or more aspects of the operation of these air moving devices, particularly in situations where cooling and/or ventilation systems include a plurality of air moving devices. It has been recognized that significant benefits can be gained from controlling aspects of the operation of air moving devices. For example, control circuitry may be employed to influence the speed of an air moving device in response to the ambient temperature inside an electronic device or system (e.g., after a decrease in ambient temperature is detected, the speed of the air moving device is decreased). As a result, the air moving device may be operated at less than its maximum abilities, while still meeting any device or system cooling specifications. By operating an air moving device below its maximum abilities, significant audio noise reduction and power consumption reduction can be achieved. In addition, the ability to operate the air moving device at a less than maximum speed, while still meeting any cooling and/or ventilating specifications, also reduces wear to the air moving device.

It has also been recognized that by synchronizing all of the air moving devices in a multiple-air moving device system, device-to-device beat frequencies can be eliminated. In addition, device synchronization provides reduced perceived audio noise, reduced chassis vibration modes, more uniform air flow, and constant air flow over time and air moving device aging.

Typically the above discussed control circuitry is located on the main printed circuit board (PCB) situated inside the electronic device, system, etc., the one or more air moving devices are employed to cool and/or ventilate. Normally, this centralized control circuitry controls all air moving devices within the electronic device or system. One undesirable side effect of such centralized control circuitry is a lack of redundancy. For example, in at least some instances, if the central control circuitry fails for some reason, so to do all of the air moving devices of the cooling system.

Another notable disadvantage of such centralized circuitry is that it occupies valuable system or device space.

Space within an electronic device and/or system is scarce. Therefore, centralized control circuitry, or any circuitry extending beyond the volume/profile of the air moving device(s), takes up electronic device or system space that could be otherwise occupied by other circuits, components, etc. As a result, system or device design is often comprised to accommodate such centralized control circuitry.

In response to this lack of redundancy and/or scarcity of space, some air moving device manufacturers have attempted to localize the control circuitry to the air moving device. For example, at least one manufacturer has begun incorporating control circuitry onto a PCB, which is disposed inside the hub of an air moving device.

Incorporating control circuitry into the hub of an air moving device, however, presents at least a few problems. First, in some circumstances, the control circuitry needed to facilitate all of the desired functions for an air moving device may be too large to incorporate into the hub of the air moving device. In addition, incorporating control circuitry into the hub of an air moving device normally takes cooperation between an air moving device manufacturer and a control circuitry manufacturer. For example, oftentimes, the control circuitry manufacturer must first find a device manufacturer willing to incorporate the circuit manufacturer's control circuitry into at least one of the device manufacturers' air moving devices. Furthermore, if the circuit manufacturer is able to find such a device manufacturer, oftentimes the control circuitry, as well as where the control circuitry is disposed within an air moving device, must be developed to the device manufacturer's specific air moving device. Therefore typically, the control circuitry cannot be deployed with other manufacturers' air moving devices. As a result, an undesirable single customer and/or supplier scenario arises for the circuit manufacturer. Furthermore, if an air moving device manufacturer does not want to incorporate control circuitry into the hub of the air moving device, an off the shelf version of the air moving device can not be easily converted into a device having control circuitry in its hub. In addition to the above, air moving devices having control circuitry in their hubs are relatively more expensive than fans not including such circuitry.

BRIEF SUMMARY OF THE INVENTION

The present invention is directed to a mounting apparatus for mounting control circuitry to an air moving device. In at least one embodiment, the mounting apparatus includes one or more retaining members operable to retain control circuitry for the air moving device. In various embodiments, the apparatus also includes one or more mounting members enabling the coupling of the apparatus to a portion of an air moving device other than a hub. In a preferred embodiment, the dimensions of the mounting apparatus, as well as the control circuitry, are such that when an assembly comprising the mounting apparatus and the control circuitry is coupled to the air moving device, the assembly does not protrude beyond the volume of the air moving device.

BRIEF DESCRIPTION OF THE DRAWINGS

FIG. 1A depicts a front view of an exemplary embodiment of an air moving device;

FIG. 1B depicts a side view of an exemplary embodiment of an air moving device;

DETAILED DESCRIPTION OF THE INVENTION

Figure 1C:
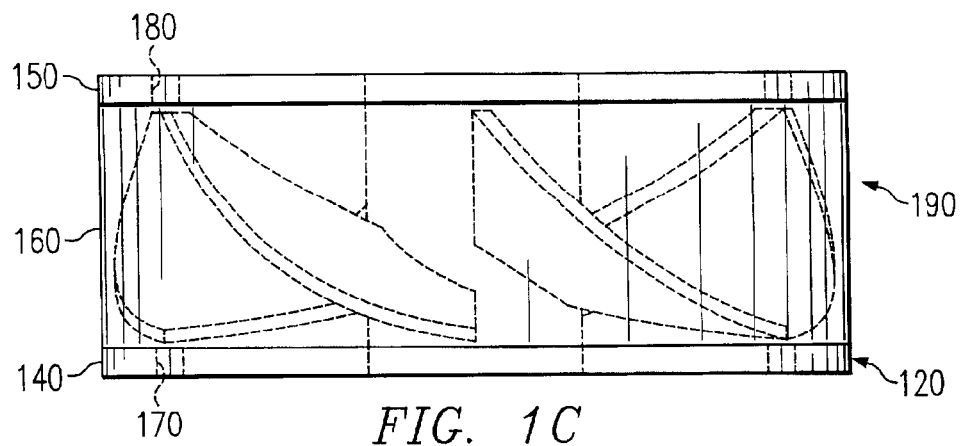
FIG. 1C depicts a top view of an exemplary embodiment of an air moving device.

FIGS. 1A, 1B, and 1C are respectively a front view, side view, and top view of an embodiment of air moving device 100. Air moving device 100 may be any one of the known air moving devices to include axial fans such as tube axial fans, vane axial fans, and the like.

In at least one embodiment, air moving device 100 includes hub 110 rotatably mounted on frame 120. A plurality of blades 130 are coupled to (e.g., integrated with) hub 110. Preferably, each of the blades are situated such that an individual blade is coupled to hub 110 at a proximal end of the blade and projects in a substantially radial direction away from the hub. Furthermore, in at least one embodiment, air moving device 100 includes a motor assembly (not shown) coupled to hub 110 operable to rotate hub 110 (and therefore, blades 130) in a given direction. In some embodiments, air moving device 100 includes electrical circuitry facilitating the operation of device 100 (e.g., circuitry facilitating the operation of the motor assembly). In at least one embodiment, at least a portion of such circuitry is incorporated on a printed circuit board (PCB). Furthermore, in one embodiment, this printed circuit board is situated in hub 110.

Frame 120, mentioned above, preferably includes rectangular first panel 140 and rectangular second panel 150, as well as circular interior portion 160 situated between panels 140 and 150. In addition, in at least one embodiment, frame 120 includes one or more supports (not shown) coupled to (e.g., integrated with) panel 140, panel 150, and/or portion 160. Furthermore, in at least one embodiment, first panel 140 and second panel 150 include one or more mounting holes (e.g., mounting holes 170 and 180) for mounting air moving device 100 to (e.g., within) an electronic device or system. Preferably, air moving device 100 may be mounted to an electronic device or system using only two of the mounting holes present on panels 140 and 150. In addition to the above, as can be seen in FIGS. 1A, 1B, and 1C, air moving device 100 includes one or more open spaces (e.g., open space 190) spanned by first panel 140, second panel 150, and/or circular inner surface 160. In at least one embodiment, air moving device 100 is a 120 mm fan carrier or other industry standard sized air moving device carrier.

It will be appreciated by one of ordinary skill in the art that the configuration of air moving device 100 in FIG. 1 is by way of example only, for air moving device 100 may have other configurations. For example, panels 140 and 150 may have a shape that is not rectangular. Similarly, portion 160 may have a shape that is not circular. Furthermore, air moving device 100 may include more, less, and/or different elements than those depicted in FIG. 1. For example, air moving device 100 may include stationary venturi. Furthermore, in at least one embodiment, air moving device 100 includes stator blades, guide vanes, stationary vanes, and/or the like. Moreover, in at least one embodiment, air moving device 100 lacks portion 160.

Figure 2:
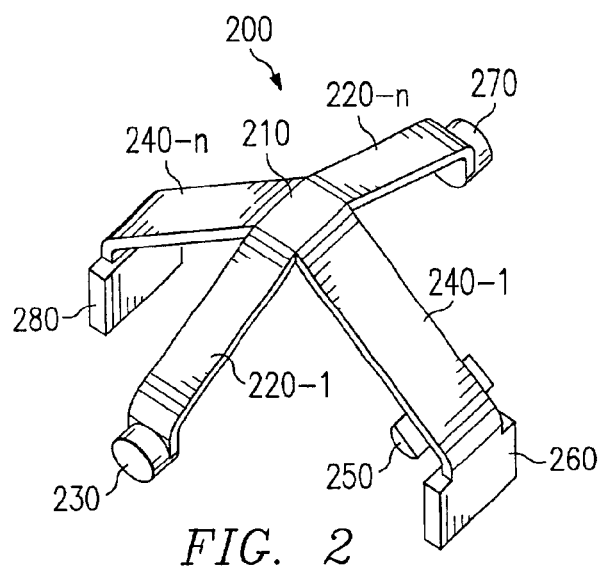
FIG. 2 depicts an exemplary embodiment of a mounting apparatus.

FIG. 2 depicts an exemplary embodiment of a mounting apparatus for coupling to device 100 control circuitry operable to control at least a portion of the operation of air moving device 100 (e.g., the speed and/or phase of device 100). Preferably, the mounting apparatus enables the mounting of the control circuitry within the volume/profile of device 100 (i.e., when coupled to device 100, the mounting apparatus and control circuitry would not occupy anymore space within an electronic device, system, etc., than the device or system space that would be occupied by device 100 sans the apparatus and control circuitry). Also preferably the mounting apparatus enables the coupling of the control circuitry to some portion of air moving device 100 other than hub 110. In various embodiments, mounting apparatus 200 includes frame 210. In at least one embodiment, frame 210 includes one or more mounting members enabling the coupling of said mounting apparatus to device 100. In the embodiment of FIG. 2, these one or more mounting members comprise mounting arms 220-1 and 220-n. Furthermore, in at least one embodiment, each of mounting arms 220-1 and 220-n includes a mounting appendage (e.g., mounting appendages 230 and 270). In some embodiments, mounting apparatus 200 is coupled to air moving device 100 by situating at least a portion of at least one mounting appendage of apparatus 100 within at least one mounting hole of frame 120. In at least one embodiment, this involves situating at least a portion of mounting appendage 230 within mounting hole 170 of frame 120 and situating at least a portion of mounting appendage 270 within mounting hole 180.

Furthermore, in at least one embodiment, frame 210 also includes one or more retaining members. In the embodiment of FIG. 2, these one or more retaining members comprise retaining arms 240-1 and 240-n. In various embodiments, the retaining members of frame 210 are operable to retain the earlier mentioned control circuitry. In at least one embodiment, the retaining members are operable to retain a printed circuit board (PCB) incorporating such control circuitry.

In some embodiments, each of retaining arms 240-1 and 240-n includes a bracing appendage (e.g., bracing appendages 260 and 280). Preferably, one or more of retaining arms 240-1 and 240-n also include securing appendage 250. In various embodiments, a PCB having control circuitry incorporated therein is situated adjacent the bracing appendages of apparatus 200. In at least one of these embodiments, securing appendage 250 secures the PCB in a position adjacent one of the bracing appendages of apparatus 200.

Furthermore, in at least one embodiment, when apparatus 200 is coupled to air moving device 100, the bracing appendage(s) helps maintain the mounting apparatus (and any control circuitry attached thereto or included therein) at a desired angle in relation to a plane bisecting both panel 140 and panel 150. In one embodiment, the bracing appendage(s) helps maintain the apparatus at such a desired angle regardless of the orientation or direction of movement of air moving device 100. Furthermore, in at least one embodiment, the bracing appendage(s) of apparatus 200 helps maintain apparatus 200 at a desired angle by bracing apparatus 200 such that the apparatus does not pivot about the rotational axis of the mounting appendage(s) of apparatus 200.

Mounting apparatus 200 may be manufactured via numerous methods. For example, in one embodiment, apparatus 200 is formed by plastic injection molding. In another embodiment, apparatus 200 is a wire form part. In yet another embodiment, apparatus 200 is formed via metal die casting. In still yet another embodiment, apparatus 200 is formed by stamping. In at least one embodiment, apparatus 200 is formed by some combination of the above.

Figure 3:
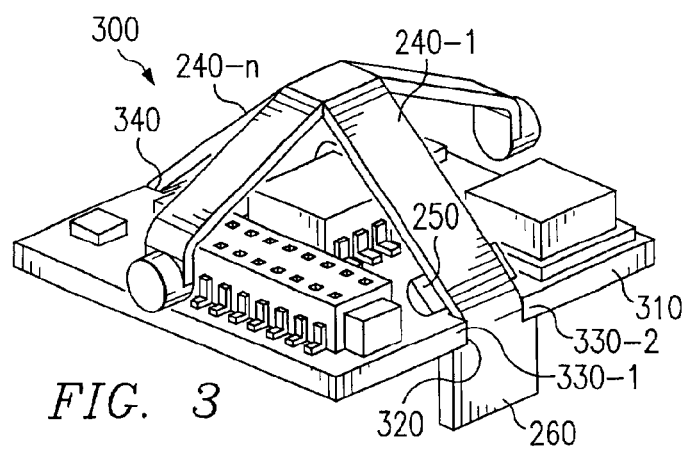
FIG. 3 depicts an exemplary embodiment of a mounting assembly including the mounting apparatus of FIG. 2.

FIG. 3 depicts an exemplary embodiment of mounting assembly 300 that includes mounting apparatus 200 and control circuitry for controlling at least a portion of the operation of air moving device 100 (e.g., the speed and/or phase of device 100). In the embodiment of FIG. 3, the control circuitry is incorporated into exemplary PCB 310. As illustrated, PCB 310 includes notch 320 for receiving retaining arm 240-1 of apparatus 200. Moreover, areas 330-1 and 330-2 of PCB 310 are situated adjacent bracing appendage 260. Furthermore, in one embodiment, securing appendage 250 helps secure PCB 310 in a position adjacent bracing appendage 260.

The situation is similar with respect to retaining arm 240-n. For example, PCB 310 includes notch 340 for receiving retaining arm 240-n. Also similar to the above, portions of PCB 310 are adjacent the bracing appendage of retaining arm 240-n. In addition, in at least one embodiment, retaining arm 240-n also includes a securing appendage that secures PCB 310 in a position adjacent the bracing appendage of arm 240-n.

In at least one embodiment, some portion of apparatus 200 is at least slightly pliable so as to facilitate the coupling of the control circuitry to apparatus 200 (e.g., facilitate the coupling of PCB 310 to apparatus 200).

The particular control circuitry employed in embodiments of the present invention (e.g., the control circuitry incorporated into PCB 310) depends upon the particular aspect of device 100's operation that is to be controlled by the circuitry. In at least one embodiment, the components of the control circuitry incorporated into PCB 310 may include an input connector(s), output connector(s), or some combination thereof, voltage regulator(s), processor(s), protection diode(s), voltage level translation circuit(s), switching element(s), isolation/hot swap circuit, indicator LED(s) (e.g., to indicate air moving device status), and/or the like. Preferably, the components of the control circuitry are such that the entire control circuitry may be built (in at least one embodiment, compactly) on one side of PCB 310, with the opposite side being operable as a ground plane. In one embodiment, the control circuitry occupies only about a square inch of board area. Exemplary embodiments of the control circuitry that may be incorporated into PCB 310 is disclosed in U.S. patent application Ser. No. 09/798,402 entitled "ADAPTIVE SYNCHRONOUS DC FAN SPEED CONTROLLER", previously incorporated herein by reference.

Similar to earlier discussions, preferably the dimensions of PCB 310, as well as those of apparatus 200, are such that when assembly 300 is coupled to air moving device 100 in such a manner that assembly 300 is situated somewhere within the volume of device 100, no portion of assembly 300 protrudes beyond the volume/profile of the air moving device. In other words, the dimensions are such that air moving device 100 with assembly 300 mounted therein would occupy no more space within an electronic device, system, etc., than device 100 would without assembly 300. In at least one embodiment, the dimensions of PCB 310 are one inch by one inch (1"×1").

It shall be appreciated by one of ordinary skill in the art that the configuration of mounting apparatus 200, PCB 310, and assembly 300 provided in FIGS. 2 and 3 is by way of example only, for mounting apparatus 200, PCB 310, and assembly 300 may have several configurations. For example, mounting apparatus 200, PCB 310 and assembly 300 may have fewer, greater, and/or different elements, as well as a different arrangement of elements, than those depicted in FIGS. 2 and/or 3. For instance, in at least one embodiment, the one or more mounting and/or retaining members of apparatus 200 may include a structure other than an arm. Moreover, rather than having separate structures for mounting and retaining, apparatus 200 may include a single structure for performing both functions. Furthermore, in one embodiment, apparatus 200 does not include mounting appendages 230 and/or 270. In addition, in at least one embodiment, two or more of the mounting arms and/or two or more of the retaining arms of apparatus 200 have different dimensions. Furthermore, in at least one embodiment where retaining arms 240-1 and 240-n have different dimensions, notch 320 and notch 340 of PCB 310 are each configured such that only one of the retaining arms may be received therein. Moreover, in at least one embodiment, PCB 310 does not include notch 320 and/or notch 340. Additionally, in at least one embodiment, circuitry (e.g., control circuitry) may be incorporated onto the back side of PCB 310. Moreover, in at least one embodiment, the control circuitry is incorporated into a structure other than a PCB.

Figure 4A:
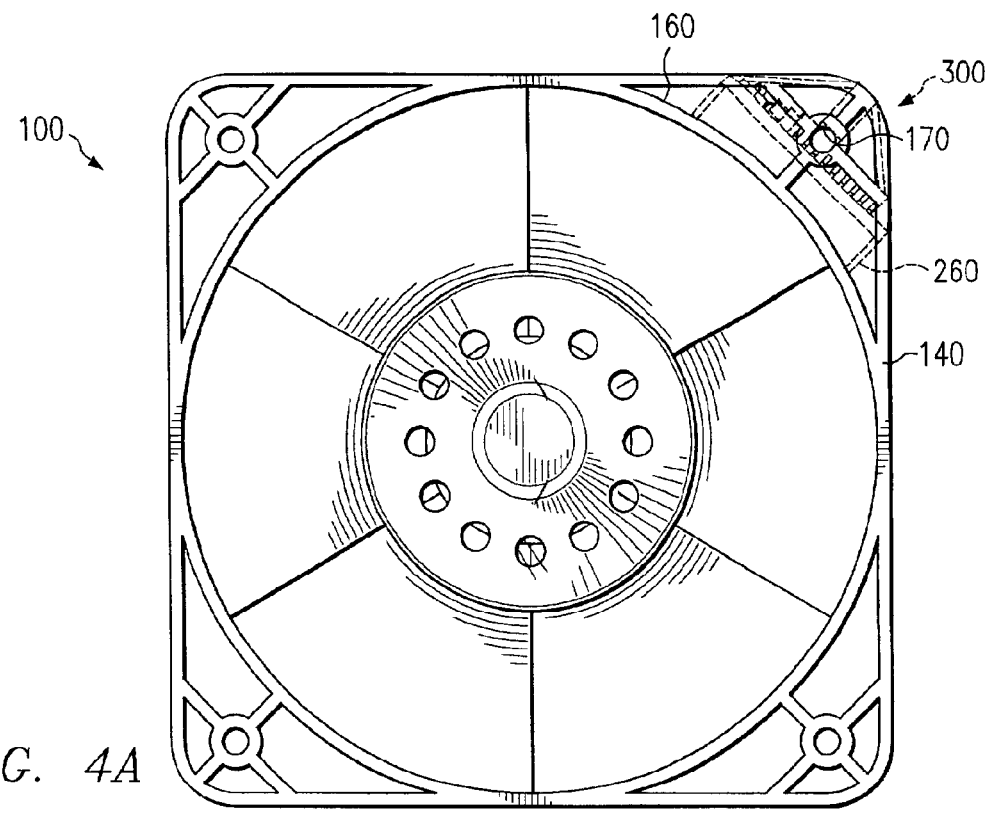
FIG. 4A depicts a front view of an exemplary embodiment of an air moving device to which the assembly of FIG. 3 has been coupled.
Figure 4B:
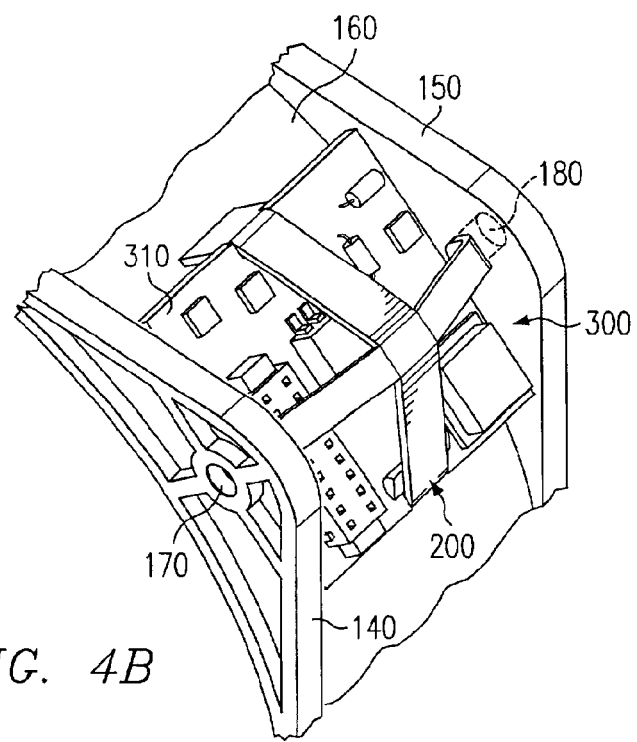
FIG. 4B depicts an aerial view of an exemplary embodiment of an air moving device to which the assembly of FIG. 3 has been coupled.

FIGS. 4A and 4B are respectively a front and aerial view of an embodiment of air moving device 100 after an embodiment of assembly 300 has been coupled thereto. In the FIGS. 4A and 4B, assembly 300 is disposed within the volume of air moving device 100. In particular, assembly 100 is situated within open space 190. Moreover, in FIGS. 4A and 4B, assembly 300 does not protrude beyond the volume of air moving device 100. More particularly, assembly 300 does not protrude beyond open space 190.

Furthermore, as shown in FIGS. 4A and 4B, the bracing appendage(s) of apparatus 200 brace the apparatus such that apparatus 200 (as well as PCB 310) does not pivot about the rotational axis of the mounting appendage(s) of apparatus 200. As mentioned earlier, preferably, the bracing appendage (s) aids in maintaining the apparatus 200 and/or the control circuitry at a desired angle in relation to a plane bisecting both panel 140 and panel 150. In FIGS. 4A and 4B, the bracing appendage(s) helps maintain the apparatus at such a desired angle regardless of the orientation or direction of movement of air moving device 100 (e.g., if assembly 300 was situated in space 195 of FIG. 1, instead of space 190). In at least one embodiment, the above described desired angle of orientation is approximately 45°. In such embodiments, a 45° angle is desired because, for such embodiments, a 45° angle maximizes the size of the control circuitry PCB that may be mounted to device 100.

In FIGS. 4A and 4B, assembly 300 is coupled to air moving device 100 by situating at least a portion of mounting appendage 230 within mounting hole 170, as well as situating at least a portion of mounting appendage 270 within mounting hole 180. However, it will be appreciated by one of ordinary skill in the art that this particular method of coupling assembly 300 to device 100 is by way of example only, for assembly 300 may be coupled through other means. For, example, in at least one embodiment, assembly 300 is mounted to device 100 through the use of an adhesive. In another embodiment, assembly 300 is soldered to device 100. In yet another embodiment, device 110 includes supports and/or struts to which assembly 300 maybe secured.

Furthermore, in at least one embodiment, assembly 300 is secured to air moving device 100, e.g., through screws, bolts, or other fastening means. For example, in one embodiment, a portion of a screw, bolt, etc., is passed through mounting hole 170 and at least partially within mounting appendage 230 and/or some other portion of mounting member 220-1. Similarly, a portion of another screw, bolt, etc., is passed through mounting hole 180 and at least partially within mounting appendage 270 and/or some other portion of mounting member 220-n. Moreover, in at least one embodiment, a single screw, bolt, etc. is passed through mounting appendages 230 and 270 and/or some other portion of mounting members 220-1 and 220-n, as well as through mounting holes 170 and 180.

In at least one embodiment, as part of mounting the above discussed control circuitry to air moving device 100, the control circuitry is communicatively coupled to some portion of the earlier mentioned electrical circuitry of air moving device 100. For example, in at least one embodiment, PCB 310 is communicatively coupled to some portion of the earlier mentioned electrical circuitry of air moving device 100. In addition to or in lieu of the above, in at least one embodiment, the control circuitry is acommunicatively coupled to an exterior connector operable to communicatively couple the control circuitry and/or device 100 to one or more other components of the earlier mentioned electrical device, system, etc. In at least one such embodiment, PCB 310 is communicatively coupled to the exterior connector.

Figures 5, 6:
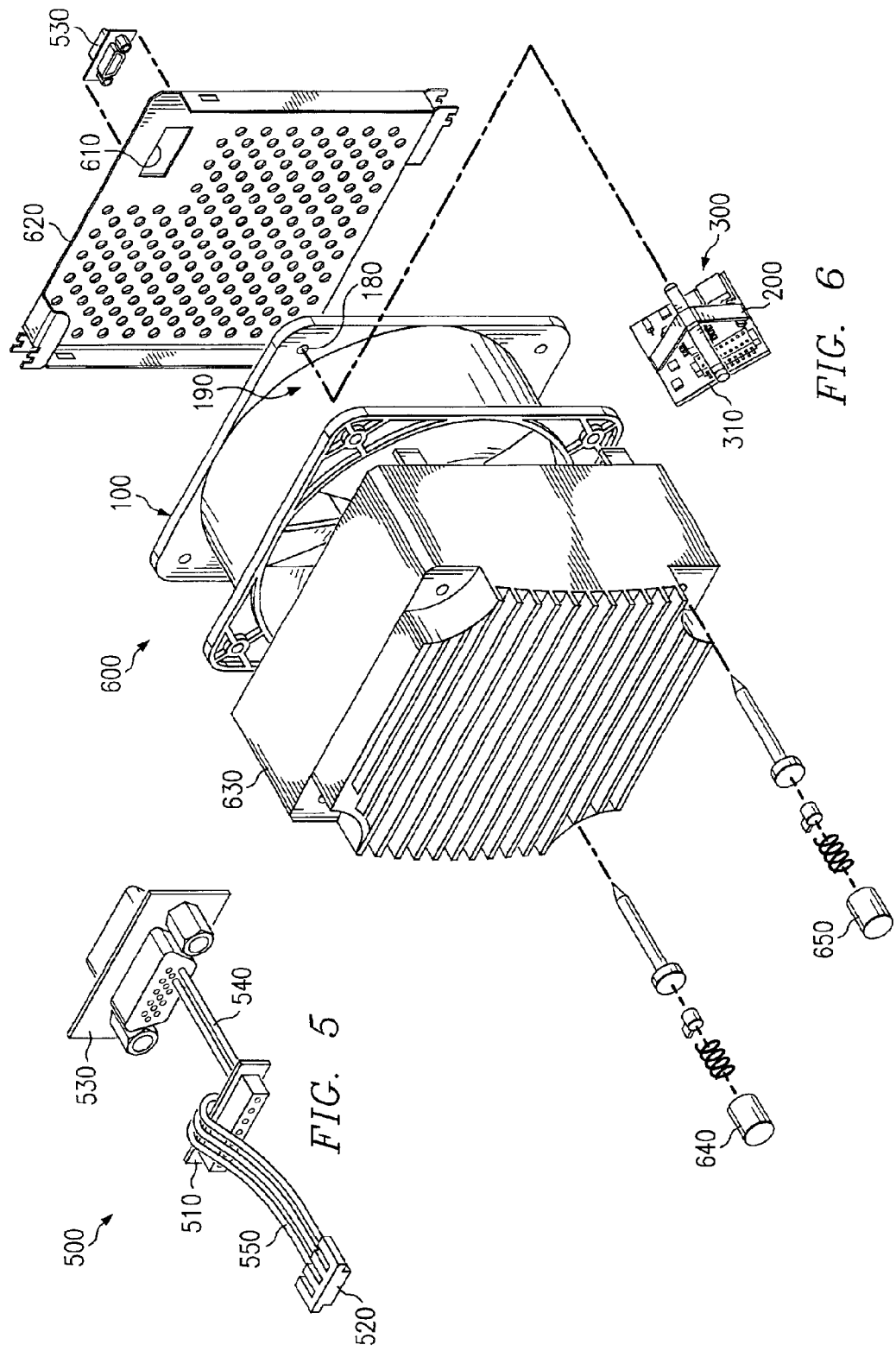
FIG. 5 depicts an exemplary embodiment of a connector assembly.
FIG. 6 is an exploded isometric view of an air moving unit assembly.

FIG. 5 depicts an exemplary embodiment of connector assembly 500 operable to communicatively couple circuitry of device 100 to PCB 310 and/or PCB 310 to the above described external connector. In at least one embodiment, connector assembly 500 includes cable assembly 540, input/output connector 510, cable assembly 550, and air moving device connector 520. In at least one embodiment, PCB 310 is communicatively coupled to air moving device 100 by coupling connector 510 to a header incorporated into PCB 310, as well as coupling air moving device connector 520 to a header included in the circuitry of air moving device 520. In at least one embodiment, the above discussed headers comprise the "male" portions of a connector board incorporated into the respective circuitry.

Also, in various embodiments, PCB 310 is communicatively coupled to exterior connector 530 by coupling cable assembly 540 to exterior connector 530, as well as to input/output connector 510. In at least one embodiment, exterior connector 530 is coupled to the frame of device 100.

It will be appreciated by one of ordinary skill in the art that the configuration of connector assembly 500 depicted in FIG. 5 is by way of example only for connector assembly 500 may have several different configurations. In addition, PCB 310 may be communicatively coupled to circuitry of air moving device 100 and/or one or more other components of the electronic device, system, etc., by some means other than connector 500. For example, in at least one embodiment, rather than employing connector assembly 500, PCB 310 is directly wired to the circuitry of air moving device 100, as well as exterior connector 520 (and/or to the other device, system, etc., components themselves). Similarly, in at least one embodiment, a portion of connector assembly 500 is directly wired to PCB 310 or air moving device 100, rather than including input/output connector 510 or device 520. Moreover, in at least one embodiment, the circuitry of device 100 includes a connector which itself includes a cable assembly. This cable assembly is coupled to a larger cable assembly that may be coupled to input and output connectors of PCB 310.

In addition, in at least one embodiment, air moving device 100 is part of an air moving unit assembly. Non-limiting examples of locations for exterior connector 530 and the above discussed control circuitry within an exemplary air moving unit assembly 600 is depicted in FIG. 6. As illustrated, air moving unit assembly 600 includes housing 630, rear panel 620, and air moving device 100. These three structures are fastened together by fastening members 640 and 650. As shown, PCB 310, as part of assembly 300, may be mounted within the volume of device 100. Furthermore, exterior connector 520 may be at least partially disposed within an opening 610 in rear panel 620.

It will be appreciated from the above detailed description that the invention offers many advantages over the prior art. For example, because in various embodiments, the assembled apparatus and control circuitry may be mounted within the volume/profile of the air moving device, the assembled apparatus and control circuitry does not take up any more device, system, etc., space than the air moving device itself. As a result, valuable real estate in the electronic device, system, etc. can be freed up for other components. In addition, device or system design need not be compromised to accommodate control circuitry.

Moreover, the air moving device itself need not be compromised to accommodate the mounting apparatus and control circuitry since, in at least one embodiment, the space in which the apparatus and control circuitry is situated is otherwise unused space of the air moving device. Furthermore, since a plurality of industry standard air moving devices include such unused space (as well as the earlier described mounting holes), various embodiment of the apparatus may be employed in a variety of air moving devices from various manufacturers. As a result, the single customer and/or supplier scenario discussed earlier may be avoided. In addition, the easy to assemble means of retaining control circuitry provided by various embodiments of the present invention provides a relatively easy means for converting an off the shelf air moving device having no control circuitry into one having such circuitry.

Furthermore since in at least one embodiment, the control circuitry is not disposed within the hub of air moving device 100, a greater number of circuit components than would normally otherwise be possible if the circuitry was disposed within the hub may be included in the control circuitry for the air moving device.

What is claimed as new and desired to be protected by Letters Patent of the United States is:

1. A mounting apparatus for mounting control circuitry to an air moving device comprising:
   at least one retaining member operable to retain control circuitry for an air moving device; and
   at least one mounting member enabling coupling of said apparatus to a portion of an air moving device other than a hub;
   wherein the dimensions of said mounting apparatus and said control circuitry are such that when an assembly comprising said mounting apparatus and said control circuitry is coupled to said air moving device, the assembly does not protrude beyond the volume of said air moving device.

2. The mounting apparatus of claim 1 wherein said at least one mounting member includes at least one mounting arm.

3. The mounting apparatus of claim 1 wherein said at least one retaining member includes at least one retaining arm.

4. The mounting apparatus of claim 1 wherein at least one of said at least one retaining member includes a bracing appendage.

5. The mounting apparatus of claim 1 wherein at least of said at least one retaining member includes a securing appendage.

6. The mounting apparatus of claim 1 wherein said mounting apparatus is operable to maintain said control circuitry at a desired angle when said apparatus is coupled to said air moving device.

7. The mounting apparatus of claim 6 wherein said desired angle is approximately forty five degrees (45°).

8. The mounting apparatus of claim 6 wherein said mounting apparatus is operable to maintain said control circuitry at said desired angle regardless of the orientation or direction of movement of said air moving device.

9. The mounting apparatus of claim 1 wherein said air moving device is an air moving device operable for use in an electronic device.

10. The mounting apparatus of claim 1 wherein said at least one retaining member and said at least mounting member are the same.

11. The mounting apparatus of claim 1 wherein said mounting apparatus includes at least one mounting means for coupling said apparatus to at least one mounting hole of said air moving device.

12. An air moving device for use in cooling applications for an electronic device, said air moving device comprising:

frame;

hub rotatably mounted to said frame;

at least one blade coupled to said hub; and mounting assembly coupled to said frame, said mounting assembly including a mounting apparatus and control circuitry, wherein said mounting assembly is situated within the volume of said air moving device.

13. The device of claim 12 wherein said mounting assembly includes at least one mounting member and at least one retaining member operable to retain said control circuitry.

14. The device of claim 12 wherein said mounting assembly is coupled to said frame via at least one mounting hole of said frame.

15. The device of claim 12 wherein said mounting assembly is situated in a space spanned by a front panel, rear panel and inner portion of said air moving device.

16. A mounting apparatus for coupling control for an air moving device used in cooling applications for electronic devices, said apparatus comprising:

retaining means for retaining control circuitry for an air moving device; and mounting means for coupling said apparatus to a portion of an air moving device other than a hub;

wherein the dimensions of said mounting apparatus and said control circuitry are such that when an assembly comprising said mounting apparatus and said control circuitry is coupled to said air moving device, the assembly does not protrude beyond the volume of said air moving device.

17. The mounting apparatus of claim 16 wherein said retaining means includes means for maintaining said control circuitry at a desired angle when said apparatus is coupled to said air moving device.

18. The mounting apparatus of claim 17 wherein said desired angle is approximately forty five degrees (45°).

19. The mounting apparatus of claim 16 wherein said means for maintaining maintains said control circuitry at said desired angle regardless of the orientation or direction of movement of said air moving device.

20. The mounting apparatus of claim 16 wherein said mounting means includes means for coupling said apparatus to at least one mounting hole of said air moving device.

* * * * *